United States Patent
Liu et al.

(10) Patent No.: US 11,035,044 B2
(45) Date of Patent: Jun. 15, 2021

(54) ETCHING SOLUTION FOR TUNGSTEN AND GST FILMS

(71) Applicant: Versum Materials US, LLC, Tempe, AZ (US)

(72) Inventors: Wen Dar Liu, Chupei (TW); Laisheng Sun, Gilbert, AZ (US); Yi-Chia Lee, Hsin Chu (TW); Tianniu Chen, Westford, MA (US); Gang Chris Han-Adebekun, Center Valley, PA (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 15/872,620

(22) Filed: Jan. 16, 2018

(65) Prior Publication Data

US 2018/0209049 A1   Jul. 26, 2018

Related U.S. Application Data

(60) Provisional application No. 62/449,290, filed on Jan. 23, 2017.

(51) Int. Cl.
| | | |
|---|---|---|
| *C09K 13/02* | (2006.01) | |
| *C23F 1/40* | (2006.01) | |
| *H01L 45/00* | (2006.01) | |
| *C23F 1/38* | (2006.01) | |

(52) U.S. Cl.
CPC .............. *C23F 1/38* (2013.01); *C23F 1/40* (2013.01); *H01L 45/1675* (2013.01); *H01L 45/06* (2013.01); *H01L 45/144* (2013.01)

(58) Field of Classification Search
None
See application file for complete search history.

(56) References Cited

U.S. PATENT DOCUMENTS

| | | | | |
|---|---|---|---|---|
| 3,976,500 | A * | 8/1976 | Fadgen, Jr. ............... | C23F 1/44 134/2 |
| 4,995,942 | A | 2/1991 | David | |
| 5,563,119 | A | 10/1996 | Ward | |
| 5,662,769 | A * | 9/1997 | Schonauer ............... | C11D 7/08 134/2 |
| 5,958,288 | A | 9/1999 | Mueller et al. | |
| 5,997,658 | A * | 12/1999 | Peters ...................... | C09D 9/00 134/38 |
| 6,083,419 | A | 7/2000 | Grumbine et al. | |
| 6,177,349 | B1 * | 1/2001 | Schonauer ........ | H01L 21/76819 257/E21.58 |
| 6,303,514 | B1 | 10/2001 | Hackett et al. | |
| 7,964,498 | B2 | 6/2011 | Kum | |
| 8,119,478 | B2 | 2/2012 | Jeong et al. | |
| 8,802,608 | B2 * | 8/2014 | Shimada ............... | C11D 3/0073 510/175 |
| 8,940,182 | B2 | 1/2015 | Hong et al. | |
| 2003/0228990 | A1 | 12/2003 | Lee et al. | |
| 2008/0051308 | A1 | 2/2008 | Kane | |
| 2008/0076688 | A1 * | 3/2008 | Barnes ................. | C11D 3/0042 510/175 |
| 2010/0048016 | A1 * | 2/2010 | Izumi ................ | H01L 21/30612 438/604 |
| 2010/0275952 | A1 | 11/2010 | Raghavan et al. | |
| 2011/0034362 | A1 | 2/2011 | Egbe | |
| 2011/0147341 | A1 | 6/2011 | Sato et al. | |
| 2012/0256122 | A1 * | 10/2012 | Sato ......................... | C23F 1/40 252/79.2 |
| 2013/0112914 | A1 | 5/2013 | Han et al. | |
| 2013/0203643 | A1 * | 8/2013 | Nakanishi ............ | C11D 3/0042 510/175 |
| 2014/0109931 | A1 | 4/2014 | Lee et al. | |
| 2015/0027978 | A1 * | 1/2015 | Barnes ................... | C09K 13/00 216/13 |
| 2015/0045277 | A1 * | 2/2015 | Liu ................... | H01L 21/02074 510/175 |
| 2015/0075570 | A1 * | 3/2015 | Wu ................... | H01L 21/02071 134/41 |
| 2015/0104952 | A1 * | 4/2015 | Cui ................... | H01L 21/02063 438/745 |
| 2016/0108284 | A1 | 4/2016 | Yoshizaki | |

(Continued)

FOREIGN PATENT DOCUMENTS

| | | |
|---|---|---|
| CN | 102221791 A | 10/2011 |
| CN | 102820223 A | 12/2012 |

(Continued)

OTHER PUBLICATIONS

Watanabe, Daisuke, et al., "High selectivity (SiN/SiO2) etching using an organic solution containing anhydrous HF," Microelectronic Engineering, 86 (2009), pp. 2161-2164.

Bermudez, V. M., "Wet-Chemical Treatment of Si3N4 Surfaces Studied Using Infrared Attenuated Total Reflection Spectroscopy," Journal of The Electrochemical Society, 152 (2), 2005, pp. F31-F36.

Seo, Dongwan, et al., "Selective wet etching of Si3N4/SiO2 in phosphoric acid with the addition of fluoride and silicic compounds," Microelectronic Engineering, 118 (2014), pp. 66-71.

Zhong, Min, et al., "Oxidant Addition Effect on Ge2Sb2Te5 Phase Change Film Chemical Mechanical Polishing," Journal of The Electrochemical Society, 155 (11) (2008) pp. H929-H931.

(Continued)

*Primary Examiner* — Shamim Ahmed
(74) *Attorney, Agent, or Firm* — William T. Slaven, IV

(57) ABSTRACT

Described herein is an etching solution suitable for both tungsten-containing metals and GST metals, which comprises: water; at least one phenolic derivative compound having at least two hydroxyl groups; at least one strong base selected from the group consisting of (i) a quaternary base; (ii) an organic amine; and (iii) a metal hydroxide; optionally an ammonium salt of an organic acid; and optionally a water-miscible solvent, wherein the pH of the etching solution is 10 or greater, and wherein the etching solution is substantially free of a peroxide oxidizer and a metal ion-containing oxidizer.

25 Claims, No Drawings

(56) References Cited

U.S. PATENT DOCUMENTS

| | | | |
|---|---|---|---|
| 2016/0122696 A1* | 5/2016 | Liu | C11D 3/0042 |
| | | | 257/798 |
| 2017/0145311 A1* | 5/2017 | Liu | C09K 13/00 |
| 2017/0335248 A1* | 11/2017 | Oie | C11D 7/02 |
| 2018/0037852 A1* | 2/2018 | Thomas | H01L 21/02063 |

FOREIGN PATENT DOCUMENTS

| | | |
|---|---|---|
| EP | 1610185 A2 | 12/2005 |
| EP | 2290046 A1 | 3/2011 |
| KR | 100640002 B | 11/2006 |
| SG | 10201609929 | 6/2017 |

OTHER PUBLICATIONS

Wang, Liangyong, et al., "Basic Wet-Etching Solutions for Ge2Sb2Te5 Phase Change Material," Journal of The Electrochemical Society, 157 (4) (2010) pp. H470-H473.

Deng, Changmeng, et al., "Selective wet etching of Ge2Sb2Te5 phase-change thin films in thermal lithography with tetramethylammonium," Applied Physics A (2011) 104, pp. 1091-1097.

Perry, Scott S., et al., "The influence of chemical treatments on tungsten films found in integrated circuits," Applied Surface Science, 7068 (2001), pp. 1-8.

Cheng, Huai-Yi, et al., "Wet etching of Ge2Sb2Te5 films and switching properties of resultant phase change memory cells," Semiconductor Science and Techonology, 20 (2005), pp. 1111-1115.

Ao-Dong, He, et al., "Mechanism of amorphous Ge2Sb2Te5 removal during chemical mechanical planarization in acidic H2O2 slurry," Chin. Phys. B, vol. 22, No. 1 (2013), pp. 018503-1-018503-5.

"Phosphoric Acid Nitride Removal," MicroTech Systems, Inc., MT Systems 2007, pp. 1-9.

Garnier, P., "Selective Silicon Nitride Etch with Hot Diluated HF—an Alternative to Orthophosphoric Acid," ECS Transactions, 69 (8) (2015), pp. 169-175.

* cited by examiner

ETCHING SOLUTION FOR TUNGSTEN AND GST FILMS

This application claims priority to provisional application U.S. Ser. No. 62/449,290 filed Jan. 23, 2017, which is incorporated herein by reference in its entirety.

BACKGROUND OF THE INVENTION

Described herein is an etching solution for tungsten-based and GST-based metals. More particularly, described herein is an etching solution with excellent selective etching properties for tungsten-based and GST-based metals with respect to other metals and dielectric layers during the manufacture of a microelectronic device.

Various types of non-volatile memory devices employ materials that can be caused to selectively exhibit more than one value of electrical resistivity. To form a single memory cell (i.e., one bit), a volume of such a material may be provided between two electrodes. A selected voltage (or current) may be applied between the electrodes, and the resulting electrical current (or voltage) there between will be at least partially a function of the particular value of the electrical resistivity exhibited by the material between the electrodes. A relatively higher electrical resistivity may be used to represent a "1" in binary code, and a relatively low electrical resistivity may be used to represent a "0" in binary code, or vice versa. By selectively causing the material between the electrodes to exhibit relatively high and low values of electrical resistivity, the memory cell can be selectively characterized as exhibiting either a "1" or a "0" value.

One particular type of such non-volatile memory devices is the phase change memory device (PRAM). In a phase change memory device, the materials provided between the electrodes typically are capable of exhibiting at least two microstructural phases or states, each of which exhibits a different value of electrical resistivity. For example, the so-called "phase change material" may be capable of existing in a crystalline phase (i.e., the atoms of the material exhibit relative long-range order) and an amorphous phase (i.e., the atoms of the material do not exhibit any or relatively little long-range order). Typically, the amorphous phase is formed by heating at least a portion of the phase change material to a temperature above the melting point thereof, and then rapidly quenching (i.e., cooling) the phase change material to cause the material to solidify before the atoms thereof can assume any long-range order. To transform the phase change material from the amorphous phase to a crystalline phase, the phase change material is typically heated to an elevated temperature below the melting point, but above a crystallization temperature, for a time sufficient to allow the atoms of the material to assume the relatively long-range order associated with the crystalline phase. For example, $Ge_2Sb_2Te_5$ (referred to herein as "GST") is often used as a phase change material. This material has a melting point of about 620° C., and is capable of existing in amorphous and crystalline states. To form the amorphous (high resistivity) phase, at least a portion of the material is heated to a temperature above the melting point thereof by applying a relatively high current through the material between the electrodes (the heat being generated due to the electrical resistance of the phase change material) for as little as 10 to 100 nanoseconds. As the GST material quickly cools when the current is interrupted, the atoms of the GST do not have sufficient time to form an ordered crystalline state, and the amorphous phase of the GST material is formed. To form the crystalline (low resistivity) phase, at least a portion of the material may be heated to a temperature of about 550° C., which is above the crystallization temperature and near, but below, the melting point of the GST material, by applying a relatively lower current through the GST material between the electrodes for a sufficient amount of time (e.g., as little as about 30 nanoseconds) to allow the atoms of the GST material to assume the long-range order associated with the crystalline phase, after which the current flowing through the material may be interrupted. The current passed through the phase change material to cause a phase change therein may be referred to as the "programming current."

Tungsten (W) or tungsten alloys are often used for gate electrodes of thin-film transistors, wirings, barrier layers, or for filling of contact holes or via holes in PRAM and other semiconductor devices. They are also used as tungsten heaters in MEMS (Micro Electro Mechanical Systems).

Both GST and tungsten or tungsten alloys are typically formed into films by CVD or sputtering. When films are formed by these methods, however, they also adhere on substrate (wafer) back sides, on substrate (wafer) edges, on the external walls of film-forming apparatuses and in exhaust pipes, in addition to the actual element-forming areas in the semiconductor devices, and they peel off and produce extraneous material on and around the device. This is often countered by removing the unwanted film with an etching solution. In such instances, it is preferable to employ highly productive wet etching instead of dry etching for tungsten/tungsten alloys in the production steps of semiconductor devices, PRAM devices, and MEMS devices. Wet etching is particularly suitable for PRAM devices and MEMS devices which do not require the same level of working precision as semiconductor devices.

Mixtures of hydrofluoric acid and nitric acid are widely known as etching solutions for tungsten-based metals, but these have their drawbacks such as they tend to be too strong and also remove silicon substrates and silicon dioxide films as well as glass substrates also dissolve. Another problem is that metals that are prone to corrosion, such as Al wirings, in the devices are also etched. Hydrogen peroxide water-based etching solutions are also known in the art, however, the etching speed is slow and the pH varies as tungsten dissolves, resulting in a variable etching rate and poor etching selectivity.

Tungsten is resistant to acidic and basic solution, however, higher etch rates could be reached by adding an oxidizer to the solution such as, for example, hydrogen peroxide and/or ferric ions. GST, on the other hand, has an etch rate that is too high with an acidic solution and an etch rate that is very low in an alkaline solution that can be increased with the addition of an oxidizer such as hydrogen peroxide. Thus, an oxidizer aids the etch rate of both GST and tungsten materials but at different pH levels.

There is thus a need in the art for an etch solution that can be employed to etch both GST and tungsten/tungsten-containing metals. It would be desirable to develop a chemistry that does not include hydrogen peroxide or metal ion oxidizers such as ferric ions and still be used in single wafer tool at room temperature for less than 1 minute.

BRIEF SUMMARY OF THE INVENTION

Described herein is an etching solution suitable for both tungsten-containing metals and GST metals, which comprises, consists essentially of, or consists of: water; at least one phenolic derivative compound having at least two hydroxyl groups; at least one strong base selected from the group consisting of (i) a quaternary base having the general formula $NR^1R^2R^3R^4OH$, wherein $R^1$, $R^2$, $R^3$ and $R^4$ may be the same as or different from one another and are selected from the group consisting of hydrogen, straight-chained or branched $C_1$-$C_6$ alkyl, and substituted or unsubstituted $C_6$-$C_{10}$ aryl, (ii) an organic amine having the general formula $NR^1R^2R^3$, wherein $R^1$, $R^2$ and $R^3$ may be the same as or different from one another and are selected from the group consisting of hydrogen, straight-chained or branched $C_1$-$C_6$ alkyl, and a straight-chained or branched $C_1$-$C_6$ alcohol, and (iii) a metal hydroxide; optionally an ammonium salt of an organic acid; and optionally a water-miscible solvent, wherein the pH of the etching solution is 8.5 or greater or 10 or greater, and wherein the etching solution is substantially free of a peroxide oxidizer and a metal ion-containing oxidizer.

In some examples of the etching solution of the invention, it may comprise from about 20% to about 99% by weight of said water; from about 0.1% to about 15% by weight of said at least one phenolic derivative compound having at least two hydroxyl groups; from about 1% to about 60% by weight of said at least one strong base; from about 0% to about 20% by weight of said ammonium salt of an organic acid; and from about 0% to about 75% by weight of said water-miscible solvent. The etching solution may comprise from about 50% to about 99% by weight of said water; from about 0.5% to about 10% by weight of said at least one phenolic derivative compound having at least two hydroxyl groups; from about 1% to about 30% by weight of said at least one strong base; from about 0% to about 10% by weight of said ammonium salt of an organic acid; and from about 0% to about 50% by weight of said water-miscible solvent. The etching solution may comprise from about 70% to about 99% by weight of said water; from about 1% to about 5% by weight of said at least one phenolic derivative compound having at least two hydroxyl groups; from about 1% to about 20% by weight of said at least one strong base; from about 0% to about 5% by weight of said ammonium salt of an organic acid; and from about 0% to about 20% by weight of said water-miscible solvent. Alternative examples of the etching solution of the invention comprise the components in any of the amounts, in any combination, as they are described in the specification below.

In another embodiment, there is provided a method for etching both GST metal and tungsten metal from a microelectronic device comprising at least one of GST metal and tungsten metal during the manufacture of the microelectronic device, the method comprises, consists essentially of, or consists of the steps of: contacting the microelectronic device with an aqueous etching solution for a time sufficient to at least partially remove the GST metal and the tungsten metal from the device at a rate of from about 1 to about 40 Å/min, wherein the aqueous etching solution comprises, consists essentially of, or consists of: water; at least one phenolic derivative compound having at least two hydroxyl groups; at least one strong base selected from the group consisting of (i) a quaternary base having the general formula $NR^1R^2R^3R^4OH$, wherein $R^1$, $R^2$, $R^3$ and $R^4$ may be the same as or different from one another and are selected from the group consisting of hydrogen, straight-chained or branched $C_1$-$C_6$ alkyl, and substituted or unsubstituted $C_6$-$C_{10}$ aryl, (ii) an organic amine having the general formula $NR^1R^2R^3$, wherein $R^1$, $R^2$ and $R^3$ may be the same as or different from one another and are selected from the group consisting of hydrogen, straight-chained or branched $C_1$-$C_6$ alkyl, and a straight-chained or branched $C_1$-$C_6$ alcohol, and (iii) a metal hydroxide; optionally an ammonium salt of an organic acid; and optionally a water-miscible solvent, wherein the pH of the etching solution is 8.5 or greater or 10 or greater, and wherein the etching solution is substantially free of a peroxide oxidizer and a metal ion-containing oxidizer. Any of etching solutions of this invention may be used in the method of this invention.

The embodiments of the invention can be used alone or in combinations with each other.

DETAILED DESCRIPTION OF THE INVENTION

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted, but also include the partially closed or closed terms of "consisting essentially of" and "consisting of". Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention. All percentages are weight percentages and all weight percentages are based on the total weight of the composition (prior to any optional concentration and/or dilution thereof).

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The present invention relates generally to compositions useful for the selective removal of GST and tungsten-containing metals from a microelectronic device having such material(s) thereon.

For ease of reference, "microelectronic device" corresponds to semiconductor substrates, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, and other refractory metals and their nitrides and silicides.

"Substantially free" is defined herein as less than 1 wt. %, preferably less than 0.5 wt. %, more preferably less than 0.1 wt. %, or less than 0.01 wt. %, and most preferably less than 0.001 wt % or less than 0.0001 wt %, or less than 1 ppb. "Substantially free" also includes 0.0000 wt. % and 0 ppb. The term "free of" means 0.0000 wt. % or 0 ppb.

As used herein, "about" is intended to correspond to ±5% of the stated value.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

In the broad practice of this aspect, the etching solution suitable for both tungsten-containing metals and GST metals according to the present development comprises, consists essentially of, or consists of, in effective etching amounts: water; at least one phenolic derivative compound having at least two hydroxyl groups; at least one strong base selected from the group consisting of (i) a quaternary base having the general formula $NR^1R^2R^3R^4OH$, wherein $R^1$, $R^2$, $R^3$ and $R^4$ may be the same as or different from one another and are selected from the group consisting of hydrogen, straight-chained or branched $C_1$-$C_6$ alkyl, and substituted or unsubstituted $C_6$-$C_{10}$ aryl, (ii) an organic amine having the general formula $NR^1R^2R^3$, wherein $R^1$, $R^2$ and $R^3$ may be the same as or different from one another and are selected from the group consisting of hydrogen, straight-chained or branched $C_1$-$C_6$ alkyl, and a straight-chained or branched $C_1$-$C_6$ alcohol; optionally an ammonium salt of an organic acid; and optionally a water-miscible solvent, wherein the pH of the etching solution is 10 or greater, and wherein the etching solution is substantially free of a peroxide oxidizer and a metal ion-containing oxidizer.

In some embodiments, the etching solution compositions disclosed herein are formulated to be substantially free of or free of at least one, more than one in any combination, or all of the following chemical compounds: hydrogen peroxide and other peroxides; organic oxidizing agents; inorganic oxidizers such as, for example, nitric acid, perchloric acid, and sulfuric acid; metal containing oxidizing agents, such as $Fe^{3+}$ and $Ce^{4+}$; fluorides; and abrasive materials.

In other embodiments, the compositions of the present disclosure are, alone or additionally, free of or substantially free of added phosphorus-containing compounds.

Water

The etching solution compositions of the present development are aqueous-based and, thus, comprise water. In the present invention, water functions in various ways such as, for example, to dissolve one or more solid components of the composition, as a carrier of the components, as an aid in the removal of metallic residue, as a viscosity modifier of the composition, and as a diluent. Preferably, the water employed in the cleaning composition is de-ionized (DI) water.

It is believed that, for most applications, water will comprise, for example, from about 20% to about 80% by wt., or about 20% to about 90% by wt., or about 20% to about 99% by wt., or about 30% to about 80% by wt., or about 30% to about 90% by wt., or about 30% to about 99% by wt., or 40% to about 80% by wt., or about 40% to about 90% by wt., or about 40% to about 99% by wt. of water. Other preferred embodiments of the present invention could comprise from about 50% to about 80% by wt., or about 50% to about 90% by wt., or about 50% to about 99% by wt. or about 60% to about 80% by wt., or about 60% to about 90% by wt., or about 60% to about 99% by wt. of water. Still other preferred embodiments of the present invention could include water in an amount to achieve the desired weight percent of the other ingredients.

Phenolic Derivatives

The etching solution compositions of the present development comprise at least one phenolic derivative compound having at least two hydroxyl groups.

Illustrative phenolic derivative compounds having at least two hydroxyl groups include gallic acid, catechol, t-butyl catechol, p-benzenediol, m-benzenediol, o-benzenediol, 1,2,3-benzenetriol, 1,2,4-benzenetriol, and 1,3,5-benzenetriol. In some embodiments, mixtures of at least two of these compounds are employed in the etching solution compositions. In some embodiments, gallic acid is the preferred phenolic derivative.

It is believed that the amount of the phenolic derivative compound(s) in the etching composition of the present development will be from about 0.10% to about 15%, or about 0.10% to about 10%, or about 0.10% to about 8% by weight of the composition. Preferably the phenolic derivative comprises from about 0.5% to about 5.0% by weight and, most preferably, from about 1.0% to about 3.0% by weight of the composition. In other embodiments, the phenolic derivative comprises from about 1.5% to about 5.0% by weight and, more preferably, from about 2.0% to about 3.0% by weight and, most preferably, about 3.0% by weight of the composition.

In some embodiments where the composition has been diluted for use, the phenolic derivative comprises from about 0.1% to about 0.5% by weight and, most preferably, from about 0.2% to about 0.3% by weight of the composition.

Strong Base

The etching solution compositions of the present development comprise a strong base such as, for example, a quarternary ammonium compound (such as, for example, a tetraalkylammonium hydroxide), an organic amine, an alkali metal hydroxide, or mixtures thereof.

Tetraalkylammonium hydroxide bases contemplated herein include compounds having the formula $NR^1R^2R^3R^4OH$, wherein $R^1$, $R^2$, $R^3$ and $R^4$ may be the same as or different from one another and are selected from the group consisting of hydrogen, straight-chained or branched $C_1$-$C_6$ alkyl (e.g., methyl, ethyl, propyl, butyl, pentyl, and hexyl), and substituted or unsubstituted $C_6$-$C_{10}$ aryl, e.g., benzyl. Tetraalkylammonium hydroxides that are commercially available include tetraethylammonium hydroxide (TEAH), tetramethyammonium hydroxide (TMAH), tetrapropylammonium hydroxide (TPAH), tetrabutylammonium hydroxide (TBAH), tributylmethylammonium hydroxide (TBMAH), benzyltrimethylammonium hydroxide (BTMAH), and combinations thereof, may be used. Tetraalkylammonium hydroxides which are not commercially available may be prepared in a manner analogous to the published synthetic methods used to prepare TMAH, TEAH, TPAH, TBAH, TBMAH, and BTMAH, which are known to one ordinary of skill in the art. Another widely used quaternary ammonium base is choline hydroxide. In some embodiments, TEAH is preferred.

Illustrative organic amines that may be useful in specific compositions include species having the general formula $NR^1R^2R^3$, wherein $R^1$, $R^2$ and $R^3$ may be the same as or different from one another and are selected from the group consisting of hydrogen, straight-chained or branched $C_1$-$C_6$ alkyl (e.g., methyl, ethyl, propyl, butyl, pentyl, and hexyl) and straight-chained or branched $C_1$-$C_6$ alcohol (e.g., methanol, ethanol, propanol, butanol, pentanol, and hexanol). Most preferably, at least one of $R^1$, $R^2$ and $R^3$ is a straight-chained or branched $C_1$-$C_6$ alcohol. Examples include, without limitation, aminoethylethanolamine, N-methylaminoethanol, aminoethoxyethanol, dimethylaminoethoxyethanol, diethanolamine, N-methyldiethanolamine, monoethanolamine, triethanolamine, 1-amino-2-propanol, 2-amino-1-butanol, isobutanolamine, triethylenediamine, other $C_1$-$C_8$ alkanolamines and combinations thereof. Some embodiments may be substantially free or free of one or more of those listed organic amines or all organic amines.

Illustrative examples of alkali metal hydroxides includes lithium hydroxide, cesium hydroxide, sodium hydroxide, and potassium hydroxide.

Some embodiments may be substantially free or free of one or more of those named metal hydroxides or all metal hydroxides. For examples, some embodiments may be substantially free of or free of lithium hydroxide and sodium hydroxide.

It is believed that the amount of the strong base in the etching composition of the present development will be from about 1.0% to about 60%, or about 10% to about 50% by weight of the composition. Preferably the strong base comprises from about 5.0% to about 40% by weight and, most preferably, from about 10% to about 30% or 5% to about 30% by weight of the composition.

Ammonium Salts of Organic Acids (Optional)

The etching solution compositions of the present development may optionally further comprise an ammonium salt of an organic acid. By ammonium is meant a salt of any amine of the form $N(R^aR^bR^cR^d)^+$, wherein $R^a$, $R^b$, $R^c$, $R^d$ may all be the same or different, and may independently constitute H, $CH_3$, $C_2H_5$, and $C_3H_7$. Exemplary ammonium salts of organic acids include triammonium citrate (TAC), ammonium acetate, ammonium lactate, diammonium citrate, diammonium succinate, and combinations thereof.

The ammonium salt of an organic acid, if present, functions primarily to increase the GST etch rate.

In some embodiments the compositions of this invention will be free of or substantially free of any or all of the above-listed ammonium salts of organic acids added to the composition.

It is believed that the amount of the ammonium salt of an organic acid, if present, in the etching composition of the present development will be from about 0% to 20% by weight, or 0.1% to about 20% by weight of the composition. Preferably the ammonium salt of an organic acid, if present, comprises from about 0.5% to about 10% by weight and, most preferably, from about 0.5% to about 5.0% by weight of the composition.

Water-Miscible Solvents (Optional)

The etching solution compositions of the present invention optionally include one or more water-miscible organic solvents. Examples of water-miscible organic solvents that can be used are ethylene glycol, propylene glycol, 1,4-butanediol, tripropylene glycol methyl ether, propylene glycol propyl ether, diethylene glycol n-butyl ether (e.g. commercially available under the trade designation Dowanol DB), hexyloxypropylamine, poly(oxyethylene)diamine, dimethylsulfoxide, tetrahydrofurfuryl alcohol, glycerol, alcohols, sulfoxides, or mixtures thereof. Preferred solvents are alcohols, diols, or mixtures thereof. Most preferred solvents are diols such as, for example, propylene glycol.

It is believed that, for most applications, the amount of water-miscible organic solvent, if present, will comprise from about 0 to 75% by weight or about 5 to 75% by weight of the composition. Preferably, the solvent comprises from 5% to about 50% by weight and, most preferably, from about 5% to about 30% by weight of the composition.

In some embodiments the compositions of this invention will be free of or substantially free of any or all of the above-listed water-miscible organic solvents in any combination or all water-miscible organic solvents added to the composition.

Metal Chelating Agent (Optional)

Another optional ingredient that can be used in the cleaning composition is a metal chelating agent which typically functions to increase the capacity of the composition to retain metals in solution and to enhance the dissolution of metallic residues. Typical examples of chelating agents useful for this purpose are the following organic acids and their isomers and salts: (ethylenedinitrilo)tetraacetic acid (EDTA), butylenediaminetetraacetic acid, (1,2-cyclohexylenedinitrilo-)tetraacetic acid (CyDTA), diethylenetriaminepentaacetic acid (DETPA), ethylenediaminetetrapropionic acid, (hydroxyethyl)ethylenediaminetriacetic acid (HEDTA), N, N,N', N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrolotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, catechol, gallic acid, propyl gallate, pyrogallol, 8-hydroxyquinoline, and cysteine.

Preferred chelating agents are aminocarboxylic acids such as EDTA, CyDTA and aminophosphonic acids such as EDTMP.

It is believed that, for most applications, if present, the chelating agent will be present in the composition in an amount of from 0 to about 10% by weight, preferably in an amount of from about 0.1 wt. % to about 10 wt. %, or about 0.1 to 5% by weight, or in amount of from about 0.5 wt. % to about 5 wt. % of the composition.

In some embodiments the compositions of this invention will be free of or substantially free of any or all of the above-listed metal chelating agents (in any combination) added to the composition.

Corrosion Inhibitor (Optional)

The compositions of the present invention optionally comprise at least one corrosion inhibitor. Corrosion inhibitors serve to react with the substrate surface being cleaned, which may be a metal, particularly copper, or a nonmetal, to passivate the surface and prevent excessive etching during cleaning.

Any corrosion inhibitor known in the art for similar applications may be used. Examples of corrosion-inhibitors include aromatic hydroxyl compounds (other than the phenolic derivatives with at least the two hydroxyl groups), acetylenic alcohols, carboxyl group-containing organic compounds and anhydrides thereof, and triazole compounds.

Exemplary aromatic hydroxyl compounds include phenol, cresol, xylenol, salicyl alcohol, p-hydroxybenzyl alcohol, o-hydroxybenzyl alcohol, p-hydroxyphenethyl alcohol, p-aminophenol, m-aminophenol, diaminophenol, p-hydroxybenzoic acid, o-hydroxybenzoic acid, 2,4-dihydroxybenzoic acid, 2-5-dihydroxybenzoic acid, 3,4-dihydroxybenzoic acid and 3,5-dihydroxybenzoic acid.

Exemplary acetylenic alcohols include 2-butyne-1,4-diol, 3,5-dimethyl-1-hexyn-3-ol, 2-methyl-3-butyn-2-ol, 3-methyl-1-pentyn-3-ol, 3,6-dimethyl-4-octyn-3,6-diol, 2,4-7,9-tetramethyl-5-decyne-4,7-diol and 2,5-dimethyl-3-hexyne 2,5-diol.

Exemplary carboxyl group-containing organic compounds and anhydrides thereof include formic acid, acetic acid, propionic acid, butyric acid, isobutyric acid, oxalic acid, malonic acid, succinic acid, glutaric acid, maleic acid, fumaric acid, benzoic acid, phthalic acid, 1,2,3-benzenetricarboxylic acid, glycolic acid, lactic acid, maleic acid, acetic anhydride and salicylic acid.

Exemplary triazole compounds include benzotriazole, o-tolyltriazole, m-tolyltriazole, p-tolyltriazole, carboxybenzotriazole, 1-hydroxybenzotriazole, nitrobenzotriazole and dihydroxypropylbenzotriazole.

In an exemplary embodiment, the corrosion inhibitors include one or more of benzotriazole, carboxybenzotriazole, amino-benzotriazole, D-fructose, L-ascorbic acid, vanillin, salicylic acid, diethyl hydroxylamine, and poly(ethyleneimine).

In other embodiments, the corrosion inhibitor is a triazole and is at least one of benzotriazole, o-tolyltriazole, m-tolyltriazole, and p-tolyltriazole.

It is believed that for most applications, if present the corrosion-inhibitor will comprise from about 0.1 wt. % to about 15 wt. % of the composition; preferably it comprises from about 0.1 wt. % to about 10 wt. %, preferably, from about 0.5 wt. % to about 5 wt. %, and most preferably, from about 0.1 wt. % to about 1 wt. % or about 0.5 wt. % to about 5 wt. % of the composition.

In some embodiments the compositions of this invention will be free of or substantially free of any or all of the above-listed corrosion inhibitors added to the composition including any or all of the aromatic hydroxyl compounds (other than the phenolic derivatives with at least two hydroxyl groups) and/or any or all of the acetylenic alcohols and/or any or all of the carboxyl group-containing organic compounds and/or the anhydrides thereof, and/or any or all of the triazole compounds.

Other Optional Ingredients

The cleaning composition of the present invention may also include one or more of the following additives: surfactants, chemical modifiers, dyes, biocides, and other additives. The additive(s) may be added to the extent that they do not adversely affect the pH range of the composition.

In some embodiments the compositions of this invention will be free of or substantially free of any or all of the above-listed chelating agents added to the composition.

The additives if present, such as surfactants, chemical modifiers, dyes, biocides etc. can be included in the cleaning composition in conventional amounts, for example, amounts up to a total of about 5 weight % of the composition.

In other embodiments, the compositions will be substantially free of or free of any or all of: surfactants, chemical modifiers, dyes, biocides.

In some embodiments, the compositions of this invention may be free of or substantially free of at least one, or more than one in any combination, or all of the following, or free of any additional of the following if already present in the composition: fluorine-containing compounds, metal-containing compounds, hydroxylamine or mixtures of hydroxylamine and derivative(s) including N,N-Diethyl hydroxylamine (DEHA), isopropylhydroxylamine, or salts of hydryoxylamine, such as hydroxylammonium chloride, hydroxylammonium sulfate. In other embodiments, the composition may be substantially free of (or free of) sodium and/or calcium. In some embodiments, the compositions disclosed herein are formulated to be substantially free of at least one of the following chemical compounds: alkyl thiols, and organic silanes. In other embodiments, the composition may be substantially free of or free of a halide-containing compound, for example it may be substantially free or free of one or more of the following: fluoride-, bromine-, chlorine- or iodine-containing compounds.

pH

The pH of the etching compositions of this development may be varied to produce a composition optimized for the intended end use. In general, the pH will be basic, e.g., greater than about 8.5 and, more preferably, 10.0 or greater, or from about 10 to greater than 14, or from about 10 to about 14. Most preferably, the pH of the etching compositions will be 12 or greater, or from about 12 to greater than 14, or from about 12 to about 14. In use, it is preferred that the pH of the etching compositions be above 12 or about 12.

The range of weight percent ratios of the components will cover all possible concentrated or diluted embodiments described herein and the point of use weight percent ratios. Towards that end, in one embodiment, a concentrated etching composition is provided that can be diluted for use as an etching solution. A concentrated composition, or "concentrate," advantageously permits a user, e.g., a process engineer, to dilute the concentrate to the desired strength and pH at the point of use. Dilution of the concentrated cleaning composition may be in a range from about 1:1 to about 2500:1, preferably about 5:1 to about 200:1, wherein the cleaning composition is diluted at or just before the tool with solvent, e.g., deionized water. It is to be appreciated by one skilled in the art that following dilution, the range of weight percent ratios of the components disclosed herein should remain unchanged.

The etching solution composition of the present invention is typically prepared by mixing the components together in a vessel at room temperature until all solids have dissolved in the aqueous-based medium.

Method

In another aspect there is provided a method for etching both GST metal and tungsten metal from a microelectronic device comprising at least one of GST metal and tungsten metal during the manufacture of the microelectronic device, the method comprising the steps of: contacting the microelectronic device with an aqueous etching solution for a time sufficient to at least partially remove the GST metal and the tungsten metal from the device at a rate of from about 1 to about 40 Å/min at room temperature, wherein the aqueous etching solution comprises, consists essentially of, or consists of: water; at least one phenolic derivative compound having at least two hydroxyl groups; at least one strong base selected from the group consisting of (i) a quaternary base having the general formula $NR^1R^2R^3R^4OH$, wherein $R^1$, $R^2$, $R^3$ and $R^4$ may be the same as or different from one another and are selected from the group consisting of hydrogen, straight-chained or branched $C_1$-$C_6$ alkyl, and substituted or unsubstituted $C_6$-$C_{10}$ aryl, (ii) an organic amine having the general formula $NR^1R^2R^3$, wherein $R^1$, $R^2$ and $R^3$ may be the same as or different from one another and are selected from the group consisting of a hydrogen, straight-chained or branched $C_1$-$C_6$ alkyl, and a straight-chained or branched $C_1$-$C_6$ alcohol, and (iii) a metal hydroxide; optionally an ammonium salt of an organic acid; and optionally a water-miscible solvent, wherein the pH of the etching solution is 8.5 or 10 or greater, and wherein the etching solution is substantially free of a peroxide oxidizer and a metal ion-containing oxidizer. In some embodiments, there may be at least one additional step including a rinsing step and a drying step.

The contacting step can be carried out by any suitable means such as, for example, immersion, spray, or via a single wafer process.

The rinsing step is carried out by any suitable means, for example, rinsing the substrate with de-ionized water by immersion or spray techniques. In preferred embodiments, the rinsing step is carried out employing a mixture of de-ionized water and a water-miscible organic solvent such as, for example, isopropyl alcohol.

The drying step is carried out by any suitable means, for example, isopropyl alcohol (IPA) vapor drying or by centripetal force.

The etching solution of the invention having the composition described above has little foaming during etching of GST and tungsten-based metals, and it therefore allows uniform etching of either metal or both when both are present on the device. The etching solution of the invention is superior in that it has a low etching rate for metals other than GST and tungsten-based metals, or base materials (glass, silicon, silicon oxide, silicon nitride), and the selective etching property for GST and tungsten-based metals (the ratio of the etching rate for GST and tungsten-based metals with respect to the etching rate for metals other than GST and tungsten-based metals or base materials (glass, silicon, silicon oxide, silicon nitride)) is preferably at least 20. The etching solution of the invention may also contain components other than those mentioned above, such as moistening agents, surfactants, coloring agents, foam inhibitors and organic solvents, in ranges that do not affect the etching property.

The term "tungsten-based metal" means tungsten metal (W) or an alloy comprising tungsten as the main component (at least 70 mass %). Specific examples of tungsten alloys include molybdenum-tungsten (MoW) and tungsten silicide (WSi). The term "GST-based metal" means a chalcogenide alloy of germanium, antimony and tellurium (GeSbTe) such as, for example, $Ge_2Sb_2Te_5$.

The method of forming a film of the GST and tungsten-based metals on a substrate such as a microelectronic device is not particularly restricted, and any method such as CVD, sputtering or vapor deposition may be used, while the film-forming conditions also are not restricted.

The term "etch" or "etching" as used herein refers to a process utilizing the etching phenomenon, and it naturally includes patterning of GST and tungsten-based metals, as well as purposes of cleaning off of GST and tungsten-based metal residues. Thus, the microelectronic device may further include electronic devices of which production process has a step of dissolving off of the entirety of the GST and tungsten-based metals by an etching solution, even if no GST and tungsten-based metal remains on the final product.

Treatment of a GST and tungsten-based metal with an etching solution according to the invention will usually be accomplished by a dipping method, but other methods such as spraying or spin etching may be used for the treatment. The conditions for treatment by dipping cannot be specified for all cases since they will differ depending on the components of the etching solution and the film thickness of the GST and tungsten-based metals, but generally the treatment temperature will be from about 20-80° C. and more preferably from about 30-60° C. Such treatment may also be carried out while applying ultrasonic waves.

"At least partial removal" of the GST and tungsten-based metal (or excess metal) from the microelectronic device corresponds to at removal of at least 90% of the material, preferably at least 95% removal. Most preferably, at least 99% removal using the compositions of the present development.

Following the achievement of the desired removal action, the etching solution of the present development is readily removed from the device to which it has previously been applied, e.g., by rinse, wash, or other removal step(s), as may be desired and efficacious in a given end use application of the compositions of the present invention. For example, the device may be rinsed with a rinse solution including deionized water and/or dried (e.g., spin-dry, $N_2$, vapor-dry etc.). Thus, another aspect of the present development relates to a two-step method of removing GST and tungsten-based metal from the surface of a microelectronic device. The first step involves the contacting of the GST and tungsten-based metal-containing device with the etching solutions of the present development for a time of from about 1 minute to about 60 minutes, at temperature in a range of from about 25° C. to about 80° C., preferably about 30° C. to about 60° C., and most preferably at room temperature (about 25° C.). Thereafter, the device is contacted with a deionized water rinse at temperature in a range from about 20° C. to about 25° C. for 15 seconds to about 60 seconds.

The features and advantages are more fully shown by the illustrative examples discussed below.

EXAMPLES

General Procedure for Preparing the Cleaning Compositions

All compositions which are the subject of the present Examples were prepared by mixing 100 g of material in a 250 mL beaker with a 1" Teflon-coated stir bar. For compositions without a water-miscible organic solvent, the first material added to the beaker was deionized (DI) water. The remaining components can then be added in any order. In the examples listed in the tables the balance of each composition is water.

Compositions of the Substrate

Each substrate used in the present Examples comprised a tungsten film on a TEOS organosilicate glass (OSG) dielectric material on a silicon wafer. GST films tested were applied directly on a silicon wafer.

Processing Conditions

Etching tests were run using 100 g of the cleaning compositions in a 250 ml beaker with a ½" round Teflon stir bar set at 400 rpm. The cleaning compositions were heated to the desired temperature indicated below on a hot plate if necessary. Wafer segments approximately 1"×1" in size were immersed in the compositions under the following set of conditions.

10 minutes @ 25° C.
20 minutes @ 25° C.
10 minutes @ 35° C.
20 minutes @ 35° C.

The segments were then rinsed for 3 minutes in a DI water overflow bath and subsequently dried using filtered nitrogen. The tungsten etch rates were estimated from changes in the thickness before and after etching and was measured by CDE Eesmap. The GST etch rates were estimated by weight loss.

Etch Rate Measurement Procedure

Coupons of the wafers were measured for GST and tungsten metal layer thickness by measuring the resistivity of the layer by employing a ResMap™ model 273 resistivity instrument from Creative Design Engineering, Inc. The coupons were then immersed in the composition at the desired temperature for up to 10 minutes. Then the coupons were rinsed with de-ionized water, dried, and the thickness of the metal layer was measured. A graph of the change in thickness as a function of immersion time was made and the etch rate in Angstroms/min was determined from the slope of the curve.

The following Tables and summaries highlight the features of the present development.

TABLE 1

Variation of Components (I)

| Formulation | TEAH % | Gallic acid % | Triammonium citrate % | W etch rate Å/min | GST etch rate Å/min |
|---|---|---|---|---|---|
| 209 | 17.5 | 3 | 1 | 15.8 | 37.2 |
| 212 | 17.5 | 3 | 0 | 3.8 | 9 |
| 213 | 17.5 | 0 | 1 | 0.7 | 0.1 |

Table 1 illustrates that GST and tungsten can both be etched at a high rate when gallic acid and triammonium citrate are present in the etching solution.

TABLE 2

Variation of Components (II)

| Formulation | TEAH % | Gallic acid % | Ascorbic acid % | Catechol % | TAC % | W Å/min | GST etch Å/min |
|---|---|---|---|---|---|---|---|
| 214 | 17.5 | 1 | 0 | 0 | 1 | 13.7 | |
| 209 | 17.5 | 3 | 0 | 0 | 1 | 15.8 | 37.2 |
| 215 | 17.5 | 5 | 0 | 0 | 1 | 17.9 | |
| 230 | 17.5 | 0 | 1 | 0 | 1 | <1 | |
| 231 | 17.5 | 0 | 3 | 0 | 1 | <1 | |
| 232 | 17.5 | 0 | 5 | 0 | 1 | <1 | 41.3 |
| 233 | 17.5 | 0 | 0 | 1 | 1 | <1 | |
| 234 | 17.5 | 0 | 0 | 3 | 1 | <1 | |
| 235 | 17.5 | 0 | 0 | 5 | 1 | <1 | 34.6 |

All solutions contain 17.5% TEAH and 1% TAC.
All etch rates were measured at room temperature.
TAC = triammonium citrate Table 2 illustrates that for both GST and tungsten to be etched at a high rate, gallic acid and triammonium citrate (TAC) are preferably present in the etching solution.

TABLE 3

Effects of Component Concentration on Tungsten Etch

| Formulation | TEAH % | TAC % | Gallic acid % | W etch Å/min |
|---|---|---|---|---|
| 225 | 7 | 1 | 3 | 1.2 |
| 224 | 10.5 | 1 | 3 | 9.8 |
| 223 | 14 | 1 | 3 | 12.5 |
| 229 | 17.5 | 0 | 3 | 3.8 |
| 226 | 17.5 | 2 | 3 | 46.2 |
| 227 | 17.5 | 4 | 3 | 27.7 |
| 228 | 17.5 | 6 | 3 | 8.2 |
| 213 | 17.5 | 1 | 0 | 0.7 |
| 214 | 17.5 | 1 | 1 | 13.7 |
| 221 | 17.5 | 1 | 2 | 19.4 |
| 215 | 17.5 | 1 | 5 | 17.4 |
| 209 | 17.5 | 1 | 3 | 15.6 |

Table 3 illustrates that tungsten etch rate can be optimized.

TABLE 4

Dilution Effect of Preferred Formulation 209 (Above)

| Dilution ratio | W etch | GST etch |
|---|---|---|
| Conc | 15.8 | 37.2 |
| 3:1 | 15.6 | 32.6 |
| 1:1 | 10.9 | 35.4 |
| 1:4 | 1.1 | 34.9 |

Table 4 illustrates that preferred formulation 209 can be diluted to about a 1:1 ratio and maintain a high etch rate for both GST and tungsten.

TABLE 5

Selectivity of Preferred Formulation 209 (Above)

| Substrate | Etch rate Å/min |
|---|---|
| W | 15.6 |
| GST | 37.2 |
| Ti | 0.7 |
| TiN | 0.2 |
| Ta | 0.2 |
| TEOS | 0 |
| Si | 0 |

Table 5 illustrates that preferred formulation 209 is selective with respect to GST and tungsten versus other materials commonly found on a microelectronic device.

The foregoing description is intended primarily for purposes of illustration. Although the invention has been shown and described with respect to an exemplary embodiment thereof, it should be understood by those skilled in the art that the foregoing and various other changes, omissions, and additions in the form and detail thereof may be made therein without departing from the spirit and scope of the invention.

The invention claimed is:

1. An etching solution suitable for both tungsten-containing metals and GST metals, which comprises:
   water;
   from about 1.5% to about 5.0% by weight of gallic acid;
   from about 1% to about 60% by weight of at least one strong base selected from the group consisting of (i) a quaternary base having the general formula $NR^1R^2R^3R^4OH$, wherein $R^1$, $R^2$, $R^3$ and $R^4$ may be the same as or different from one another and are selected from the group consisting of hydrogen, straight-chained or branched $C_1$-$C_6$ alkyl, and substituted or unsubstituted $C_6$-$C_{10}$ aryl, and (ii) an organic amine having the general formula $NR^1R^2R^3$, wherein $R^1$, $R^2$ and $R^3$ may be the same as or different from one another and are selected from the group consisting of hydrogen, straight-chained or branched $C_1$-$C_6$ alkyl, and a straight-chained or branched $C_1$-$C_6$ alcohol; and
   from about 0.1% to about 20% by weight of an ammonium salt of an organic acid selected from triammonium citrate, ammonium acetate, ammonium lactate, diammonium citrate, diammonium succinate, or combinations thereof,
   wherein the pH of the etching solution is 10 or greater, and wherein the etching solution is free of oxidizer, is free of fluoride, and is free of surfactant.

2. The etching solution of claim 1 wherein the at least one strong base is a tetraalkylammonium hydroxide.

3. The etching solution of claim 1 wherein the quaternary base is selected from the group consisting of tetraethylammonium hydroxide (TEAH), tetramethyammonium hydroxide (TMAH), tetrapropylammonium hydroxide (TPAH), tetrabutylammonium hydroxide (TBAH), tributylmethylammonium hydroxide (TBMAH), benzyltrimethylammonium hydroxide (BTMAH), and combinations thereof.

4. The etching solution of claim 1 wherein the at least one strong base is an organic amine.

5. The etching solution of claim 4 wherein the organic amine is at least one selected from the group consisting of aminoethylethanolamine, N-methylaminoethanol, aminoethoxyethanol, dimethylaminoethoxyethanol, diethanolamine, N-methyldiethanolamine, monoethanolamine, triethanolamine, 1-amino-2-propanol, 2-amino-1-butanol, isobutanolamine, triethylenediamine, and combinations thereof.

6. The etching solution of claim 1 wherein the strong base is tetraethylammonium hydroxide.

7. The etching solution of claim 6 wherein said ammonium salt of an organic acid is triammonium citrate.

8. The etching solution of claim 1 wherein the solution is substantially free of bromine-, chlorine- or iodine-containing compounds.

9. The etching solution of claim 1 wherein said ammonium salt of an organic acid is triammonium citrate.

10. The etching solution of claim 1 further comprising a corrosion inhibitor.

11. The etching solution of claim 1 wherein the solution is capable of etching both GST metal and tungsten metal at a rate of about 1 to about 40 Å/min at room temperature.

12. The etching solution of claim 1 wherein the solution comprises:
    from about 10% to about 50% by weight of said at least one strong base.

13. The etching solution of claim 1 wherein the gallic acid is present from about 2.0% to about 3.0% by weight.

14. The etching solution of claim 1 wherein the pH of the etching solution is 12 or greater.

15. A method for etching both GST metal and tungsten metal from a microelectronic device comprising at least one of GST metal and tungsten metal during the manufacture of the microelectronic device, the method comprising the steps of:
    contacting the microelectronic device with an aqueous etching solution for a time sufficient to at least partially remove the GST metal and the tungsten metal from the device at a rate of from about 1 to about 40 Å/min at room temperature, wherein the aqueous etching solution comprises:
    water;
    from about 1.5% to about 5.0% by weight of gallic acid;
    from about 1% to about 60% by weight of at least one strong base selected from the group consisting of (i) a quaternary base having the general formula $NR^1R^2R^3R^4OH$, wherein $R^1$, $R^2$, $R^3$ and $R^4$ may be the same as or different from one another and are selected from the group consisting of hydrogen, straight-chained or branched $C_1$-$C_6$ alkyl, and substituted or unsubstituted $C_6$-$C_{10}$ aryl, and (ii) an organic amine having the general formula $NR^1R^2R^3$, wherein $R^1$, $R^2$ and $R^3$ may be the same as or different from one another and are selected from the group consisting of hydrogen, straight-chained or branched $C_1$-$C_6$ alkyl, and a straight-chained or branched $C_1$-$C_6$ alcohol; and
    from about 0.1% to about 20% by weight of an ammonium salt of an organic acid selected from triammonium citrate, ammonium acetate, ammonium lactate, diammonium citrate, diammonium succinate, or combinations thereof,
    wherein the pH of the etching solution is 10 or greater, and wherein the etching solution is free of oxidizer, is free of fluoride, and is free of surfactant.

16. The method of claim 15 wherein the at least one strong base is a tetraalkylammonium hydroxide.

17. The method of claim 15 wherein the quaternary base is selected from the group consisting of tetraethylammonium hydroxide (TEAH), tetramethyammonium hydroxide (TMAH), tetrapropylammonium hydroxide (TPAH), tetrabutylammonium hydroxide (TBAH), tributylmethylammonium hydroxide (TBMAH), benzyltrimethylammonium hydroxide (BTMAH), and combinations thereof.

18. The method of claim 15 wherein the etching solution further comprises the water-miscible solvent.

19. The method of claim 15 wherein the at least one strong base is an organic amine.

20. The method of claim 19 wherein the organic amine is at least one selected from the group consisting of aminoethylethanolamine, N-methylaminoethanol, aminoethoxyethanol, dimethylaminoethoxyethanol, diethanolamine, N-methyldiethanolamine, monoethanolamine, triethanolamine, 1-amino-2-propanol, 2-amino-1-butanol, isobutanolamine, triethylenediamine, and combinations thereof.

21. The method of claim 15 wherein the strong base is tetraethylammonium hydroxide.

22. The method of claim 21 wherein said ammonium salt of an organic acid is triammonium citrate.

23. The method of claim 15 wherein the etching solution further comprises a corrosion inhibitor.

24. The method of claim 15 wherein the etching solution is substantially free of bromine-, chlorine- or iodine-containing compounds.

25. The method of claim 15 wherein said ammonium salt of an organic acid is triammonium citrate.

* * * * *